(12) United States Patent
Goh et al.

(10) Patent No.: US 10,943,864 B2
(45) Date of Patent: Mar. 9, 2021

(54) PROGRAMMABLE REDISTRIBUTION DIE

(71) Applicant: Intel Corporation, Santa Clara, CA (US)

(72) Inventors: Eng Huat Goh, Penang (MY); Min Suet Lim, Simpang Ampat (MY); J-Wing Teh, Teluk Intan (MY); Bok Eng Cheah, Bukit Gambir (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/469,100

(22) PCT Filed: Nov. 29, 2017

(86) PCT No.: PCT/US2017/063727
§ 371 (c)(1),
(2) Date: Jun. 12, 2019

(87) PCT Pub. No.: WO2018/125493
PCT Pub. Date: Jul. 5, 2018

(65) Prior Publication Data
US 2020/0083157 A1    Mar. 12, 2020

(30) Foreign Application Priority Data

Dec. 29, 2016   (MY) .......................... PI 2016704869

(51) Int. Cl.
*H01L 23/525*     (2006.01)
*H01L 23/48*      (2006.01)
(Continued)

(52) U.S. Cl.
CPC .......... *H01L 23/525* (2013.01); *H01L 23/481* (2013.01); *H01L 24/02* (2013.01);
(Continued)

(58) Field of Classification Search
CPC ................. H01L 23/481; H01L 23/525; H01L 23/49816; H01L 24/17; H01L 2224/13024; H01L 2224/023
See application file for complete search history.

(56) References Cited

U.S. PATENT DOCUMENTS 8,987,868 B1 * 3/2015 Rahman ................ H01L 23/525
                                                                 257/621
9,373,603 B2 * 6/2016 Ang ........................ H01L 24/75
(Continued)

FOREIGN PATENT DOCUMENTS

| JP | 2012118060 A | 6/2012 |
| WO | WO-2016099523 A1 | 6/2016 |
| WO | WO-2018125493 A1 | 7/2018 |

OTHER PUBLICATIONS

"International Application Serial No. PCT/US2017/063727, International Search Report dated Mar. 30, 2018", 3 pgs.
(Continued)

*Primary Examiner* — Hsien Ming Lee
(74) *Attorney, Agent, or Firm* — Schwegman Lundberg & Woessner, P.A.

(57) ABSTRACT

A device and method of utilizing a programmable redistribution die to redistribute the outputs of semiconductor dies. Integrated circuit packages using a programmable redistribution die are shown. Methods of creating a programmable redistribution die are shown.

24 Claims, 9 Drawing Sheets

(51) Int. Cl.
*H01L 23/00* (2006.01)
*H01L 25/00* (2006.01)
*H01L 27/02* (2006.01)

(52) U.S. Cl.
CPC .............. *H01L 24/13* (2013.01); *H01L 24/16* (2013.01); *H01L 24/17* (2013.01); *H01L 25/50* (2013.01); *H01L 27/0203* (2013.01); *H01L 2224/02372* (2013.01); H01L 2224/02375 (2013.01); H01L 2224/13024 (2013.01); H01L 2224/13025 (2013.01); H01L 2224/16145 (2013.01); H01L 2224/16225 (2013.01); H01L 2224/17181 (2013.01)

(56) References Cited

U.S. PATENT DOCUMENTS

| | | | |
|---|---|---|---|
| 2008/0191818 A1* | 8/2008 | Lee | H01P 5/028 333/247 |
| 2008/0296697 A1 | 12/2008 | Hsu et al. | |
| 2010/0193959 A1 | 8/2010 | Grygiel | |
| 2013/0288474 A1 | 10/2013 | Mishra et al. | |
| 2017/0365587 A1* | 12/2017 | Hung | H01L 23/3114 |

OTHER PUBLICATIONS

"International Application Serial No. PCT/US2017/063727, Written Opinion dated Mar. 30, 2018", 9 pgs.
"International Application Serial No. PCT US2017 063727, International Preliminary Report on Patentability dated Jul. 11, 2019", 11 pgs.

* cited by examiner

PROGRAMMABLE REDISTRIBUTION DIE

PRIORITY APPLICATION

This application is a U.S. National Stage Application under 35 U.S.C. 371 from International Application No. PCT/US2017/063727, filed Nov. 29, 2017, published as WO 2018/125493, which claims the benefit of priority to Malaysian Application Serial Number PI 2016704869, filed 29 Dec. 2016, all of which are incorporated herein by reference in their entirety entireties.

TECHNICAL FIELD

Embodiments described herein generally relate to redistribution die for microelectronic devices.

BACKGROUND

Microelectronic devices such as integrated circuit packages often use a substrate to attach silicon dies to a larger circuit board, often called a motherboard. The substrate helps to support and protect the silicon dies, provide heat dissipation, and enable signal and power distribution. The substrate provides the interconnections to the motherboard often in the form of a ball grid array. Generally, the package ball map is determined by circuitry input/output block quadranting i.e. ball out location adjacent to respective circuitry input/output blocks and/or power bumps. In some applications, input/output blocks may be placed at an odd or opposite direction with reference to the receiver device or component on the motherboard in order to maximize silicon area utilizations.

DESCRIPTION OF EMBODIMENTS

Figure 1:
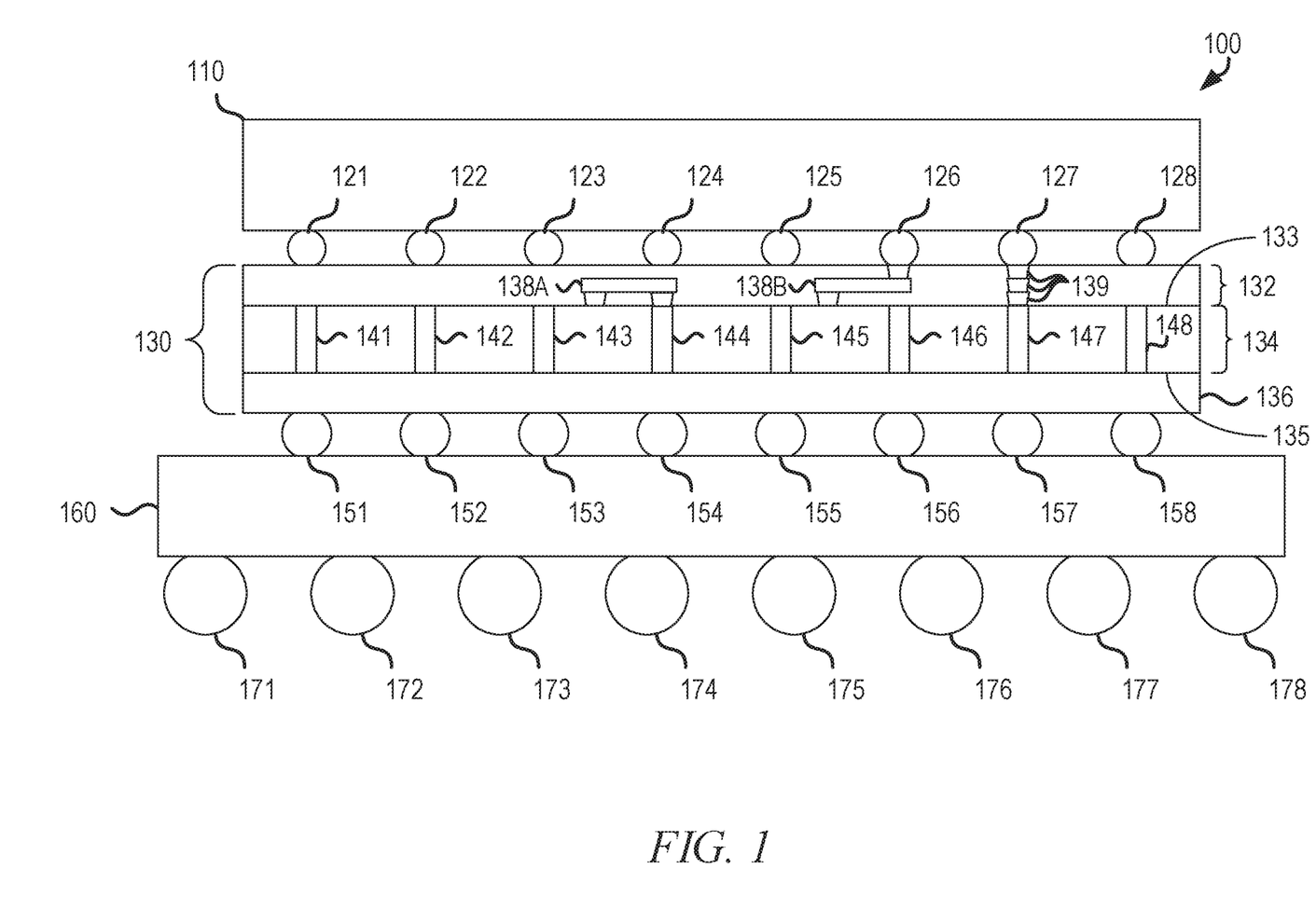
FIG. 1 is one example of a cross-sectional view of an integrated circuit package utilizing a programmable redistribution die.

FIG. 1 shows a cross-sectional view of an integrated circuit package 100 utilizing a programmable redistribution die 130. The integrated circuit package 100 includes a semiconductor die 110 attached to a programmable redistribution die 130 through a set of semiconductor die interconnects 121-128. Examples of a semiconductor die include a memory, a wireless device, a sensor, a graphics processing unit, a central processing unit, or other integrated circuit. In an example, the set of semiconductor die interconnects 121-128 is an array of micro-bumps. The programmable redistribution die is attached to a substrate 160 through a set of substrate interconnects 151-158, such as controlled collapsed chip connection bumps or metallic-solder joints. The substrate 160 includes a set of motherboard interconnects 171-178 for attaching to a motherboard. In an example, the set of motherboard interconnects is a solder ball grid array.

The programmable redistribution die 130 includes an active layer 132, a bulk silicon layer 134, a programmable redistribution layer 136, and a set of through silicon via interconnects 141-148. In an example, the set of through silicon via interconnects 141-148 is made of conductive materials. The conductive materials can include copper, aluminum, conductive composites, etc. The active layer 132 can include complementary metal oxide transistors and metal layers on a first silicon surface 133. The programmable redistribution layer 136 includes a programmable signal redistribution grid on a second silicon surface 135. The first and second silicon surfaces 133, 135 are electrically coupled using a set of through silicon via interconnects 141-148.

The programmable signal redistribution grid can be programmed to route signals from the set of through silicon via interconnects 141-148 to any of the set of substrate interconnects 151-158. The substrate interconnects 151-158 are electrically coupled to the motherboard interconnects 171-178 in order. Substrate interconnect 151 is electrically coupled to motherboard interconnect 171, substrate interconnect 152 is electrically coupled to motherboard interconnect 172, etc. The set of semiconductor die interconnects 121-128 are electrically coupled to the set of through silicon via interconnects 141-148 in a similar order. Semiconductor die interconnect 121 is electrically coupled to through silicon via interconnect 141, semiconductor die interconnect 122 is electrically coupled to through silicon via interconnect 142, etc.

The ability to program the programmable signal redistribution grid provides several benefits. Signals from the semiconductor die can be redistributed in the programmable redistribution layer 136 to optimize the signal output location to the motherboard. In an example, the signal output from the semiconductor die 110 and/or the active layer 132 at semiconductor die interconnect 125 will be closest to its destination on a motherboard if the signal is ultimately routed out through motherboard interconnect 171. The programmable redistribution grid is programmed to route the signal from through silicon via interconnect 145 to substrate interconnect 151. This outputs the signal from semiconductor die interconnect 125 from motherboard interconnect 171 thereby placing it closer to its destination on the motherboard. This can allow for shorter trace routing in the motherboard resulting in a smaller motherboard and reduced cost. Additional package substrate 160 layers to redistribute the signal in order to achieve shorter motherboard trace routing may also be avoided.

In some examples, a less critical signal, such as a low-speed bus with sub-megahertz range, can be routed through a less desirable path to accommodate a shorter or more direct path for a more critical signal, such as a clock/strobe signal and/or high-speed bus in gigahertz range. In an example, motherboard interconnect 171 is the most direct and optimum output for the signal at semiconductor interconnect 121, however the signal at semiconductor interconnect 121 is a less critical signal. Interconnect 171 is also the optimum output for the signal at semiconductor interconnect 124 and is a highly critical signal. The signal at semiconductor interconnect 124 is routed from through silicon via interconnect 144 to substrate interconnect 151, thus making the signal at semiconductor interconnect 124 output at motherboard interconnect 171. The programmable signal redistribution grid is programmed to route the signal at semiconductor interconnect 121 from through silicon via interconnect 141 to substrate interconnect 157, thus outputting the signal at semiconductor interconnect 121 at motherboard interconnect 177. Thereby, the more critical signal is routed to the most desirable path, to preserve robust signal integrity from severe signal crosstalk coupling noise and electrical losses by routing the less critical signal to a less desirable path.

The ability to customize the programming of the programmable signal redistribution grid in the programmable redistribution layer 136 allows the use of a single programmable redistribution die 130 with many different motherboards. This removes the need to redesign or customize a package and/or motherboard for a particular semiconductor device design serving multiple market segments and/or applications. Instead, the programmable signal redistribution grid of the programmable redistribution die 130 can be programmed for a variety of different motherboards. This can reduce time to market and development costs.

In some examples the programmable redistribution die 130 can include an integrated circuit, such as a central processing unit or system-on-chip within the active layer 132. The integrated circuit within the active layer 132 is electrically coupled to the programmable signal redistribution grid within the programmable redistribution layer 136 through metal routing 133A and the through silicon via interconnects 141-148. The integrated circuit within the active layer 132 is electrically coupled to semiconductor die 110 through metal routing 133B and semiconductor die interconnects 121-128. In some examples, the semiconductor die 110 may be directly coupled to the programmable redistribution layer 136 through metal vias 139 and the through silicon via interconnects 141-148 without being coupled to the integrated circuit within the active layer 132. In some examples, the semiconductor die 110 is a memory die.

Figure 2:
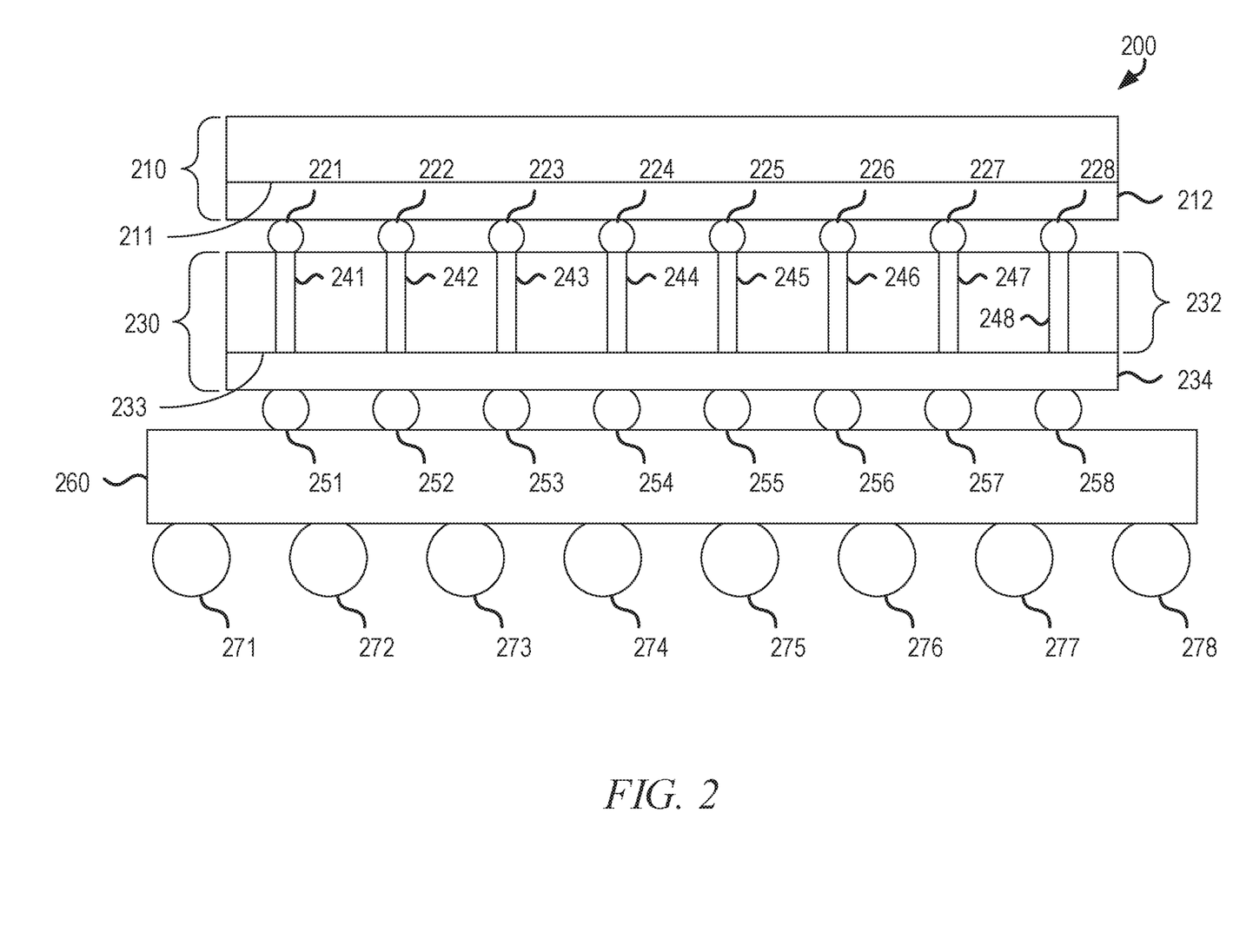
FIG. 2 is one example of a cross-sectional view of an integrated circuit package utilizing a programmable redistribution die.

FIG. 2 shows a cross-sectional view of an integrated circuit package 200 utilizing one example of a programmable redistribution die 230. The integrated circuit package 200 includes a semiconductor die 210 attached to a programmable redistribution die 230 through a set of semiconductor die interconnects 221-228. The programmable redistribution die is attached to a substrate 260 through a set of substrate interconnects 251-258. The substrate 260 includes a set of motherboard interconnects 271-278 for attaching to a motherboard.

The programmable redistribution die 230 includes a bulk silicon layer 232, a programmable redistribution layer 234, and a set of through silicon via interconnects 241-248. In an example, the set of through silicon via interconnects 241-248 is made of conductive materials. The conductive materials can include copper, aluminum, conductive composites, etc. The programmable redistribution layer 234 includes a programmable signal redistribution grid on a silicon surface 233 of the programmable redistribution layer 234. The first silicon surface 233 is electrically coupled to the set of semiconductor interconnects 221-228 on a second silicon surface 211 of the semiconductor die 210 using the set of through silicon via interconnects 241-248.

The programmable signal redistribution grid can be programmed to route signals from the set of through silicon via interconnects 241-248 to any of the set of substrate interconnects 251-258. The set of substrate interconnects 251-258 are electrically coupled to the set of motherboard interconnects 271-278 in order. Substrate interconnect 251 is electrically coupled to motherboard interconnect 271, substrate interconnect 252 is electrically coupled to motherboard interconnect 272, etc. The set of semiconductor die interconnects 221-228 are electrically coupled to the set of through silicon via interconnects 241-248 in a similar order. Semiconductor die interconnect 221 is electrically coupled to through silicon via interconnect 241, semiconductor die interconnect 222 is electrically coupled to through silicon via interconnect 242, etc.

Signals from the semiconductor die 210 can be redistributed in the programmable redistribution layer 234 to optimize the signal output location to the motherboard. In an example, the signal output from the semiconductor die 210 at semiconductor die interconnect 224 will be closest to its destination on a motherboard if the signal is ultimately routed out through motherboard interconnect 278. The programmable redistribution grid is programmed to route the signal from through silicon via interconnect 244 to substrate interconnect 258. This outputs the signal from semiconductor interconnect 224 from motherboard interconnect 278 thereby placing it closer to its destination on the motherboard. This can allow for shorter trace routing in the motherboard resulting in a smaller motherboard and reduced cost. Additional package substrate 160 layers to redistribute the signal to achieve shorter motherboard trace routing may also be avoided.

The semiconductor die 210 includes an active layer 212. The active layer 212 can include complementary metal oxide transistors and metal layers on a silicon surface. The programmable redistribution layer 234 of the programmable redistribution die 230 and the active layer 212 of the semiconductor die 210 are electrically coupled through the set of semiconductor interconnects 221-228 and the set of through silicon via interconnects 241-248.

In some examples the semiconductor die 210 is an integrated circuit die. An integrated circuit die may be a central processing unit, a system-on-chip, a memory die, an analog to digital converter, a digital to analog converter, etc. The programmable redistribution die 230 can be programmed to redistribute the outputs of the semiconductor die 210 for various motherboard layouts. This allows for prioritization of output locations for critical signals without a specially designed and fabricated part. This can reduce time to market and development costs. It can also result in a smaller package and more efficient motherboard designs.

Figure 3:
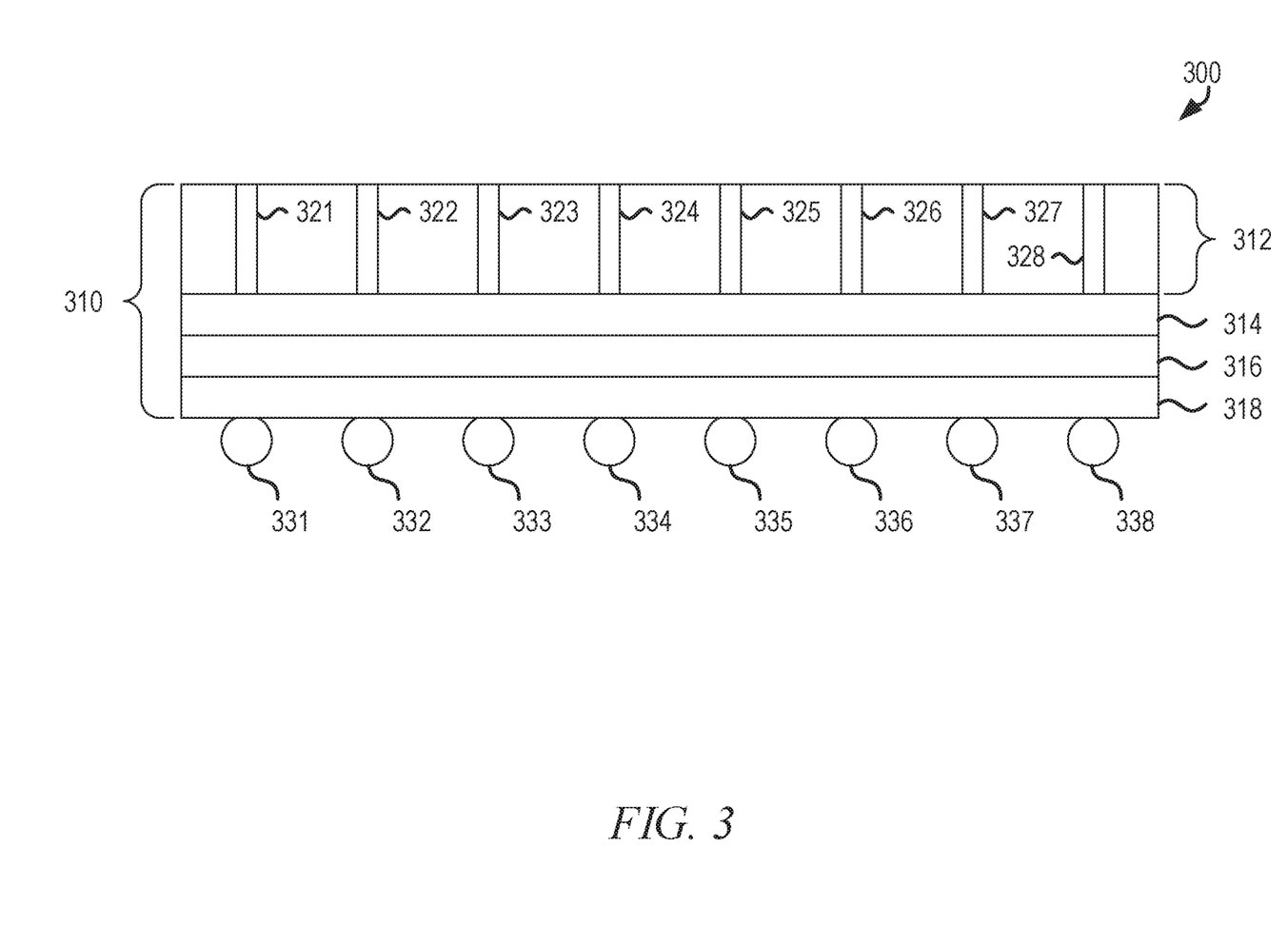
FIG. 3 is one example of a cross-sectional view of a programmable redistribution die.

FIG. 3 shows one example of a cross-sectional view of a post-bumping programmable redistribution die 300 including a set of substrate interconnects 331-338. The programmable redistribution die 310 includes a bulk silicon layer 312, a transistor gate layer 314, a vertical grid layer 316, and a horizontal grid layer 318. The transistor gate layer 314, the vertical grid layer 316, and the horizontal grid layer 318 make up a programmable signal redistribution grid. In an example, the vertical grid layer 316 is physically and electrically coupled to the horizontal grid layer 318 through metal vias. The bulk silicon layer 312 includes a set of through silicon via interconnects 321-328. In an example, the set of through silicon via interconnects 321-328 is made of conductive materials. The conductive materials can include copper, aluminum, conductive composites, etc.

The transistor gate layer 314 includes a configurable router and transistors. The configurable router includes multiplexers for selecting which transistors to activate and where to route each signal. The multiplexers are electrically coupled to the vertical grid layer 316 and the horizontal grid layer 318. Programming of the programmable redistribution die includes programming the select signal for each multiplexer to determine which horizontal and vertical interconnects of the vertical grid layer 316 and the horizontal 318 to activate. The select signals of the multiplexers can be changed or reprogrammed to alter where each signal is routed.

Each horizontal and vertical interconnect is controlled by transistor gates, such as AND gates and OR gates, which control the timing. The multiplexers determine which interconnect transistors to activate. High speed signals can be prioritized to give them a shorter or more favorable signal path through the programmable signal redistribution grid. Lower speed signals can routed through longer paths to accommodate the higher speed signals.

Instruction sets for programming the programmable redistribution signal grid are stored in a programmable redistribution die 310 memory. This allows for the use of a particular semiconductor die or silicon design in variety of applications with the programmable redistribution die 310. In some examples, not all the connections or outputs of the particular semiconductor die or silicon design are routed out through the programmable redistribution die 310. This provides the benefit of not having to pinout unused features or signals of the semiconductor die. This can allow for smaller and more cost-effective packaging.

Figure 4:
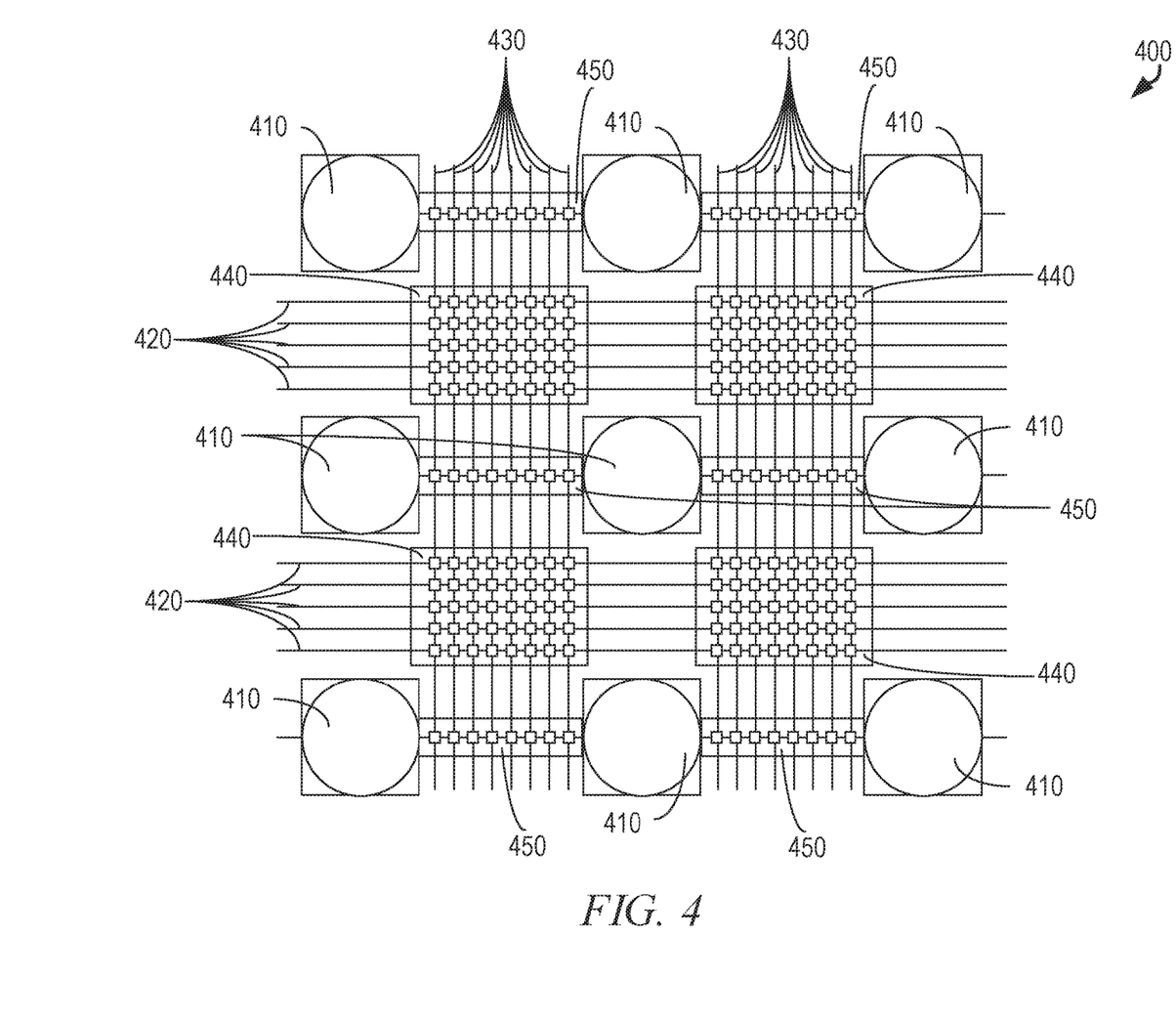
FIG. 4 is one example of a layout view of a portion of a programmable signal redistribution grid.

FIG. 4 is a layout view of a portion of a programmable signal redistribution grid 400 including redistribution grid pinouts 410, horizontal grid interconnects 420, vertical grid interconnects 430, horizontal-vertical routers 440, and horizontal routers 450. The horizontal grid interconnects 420 carry signals in a horizontal direction. The vertical grid interconnects 430 carry signals in a vertical direction. The horizontal-vertical routers 440 include multiplexers that control which grid intersections are to be connected allowing control of signal routing through the grid. The horizontal routers 450 are similarly controlled by multiplexers determining which intersections are to be connected and output through the redistribution grid pinouts 410. In some examples, the redistribution grid pinouts 410 are substrate interconnects 331-338. In an example, the horizontal routers 450 interleave or alternate with the horizontal-vertical routers 440 within the same pinout column (y-axis direction).

In some examples, each intersection is controlled by transistor gates, such as AND gates and OR gates, which in turn can be controlled by the multiplexers. High speed signals can be prioritized and directed through shorter or more favorable signal paths. Lower speed signals can be directed through longer paths to accommodate routing of the high speed and/or critical signals.

In some examples, instruction sets for programming the programmable redistribution signal grid are stored in a programmable redistribution die memory. This allows for the use of a particular semiconductor die or silicon design in variety of applications with the programmable redistribution die. In some examples, not all the connections or outputs of the particular semiconductor die or silicon design are routed out through programmable redistribution die. This provides the benefit of not having to pinout unused features or signals of the semiconductor die. This can allow for smaller and more cost-effective packaging.

Figure 5:
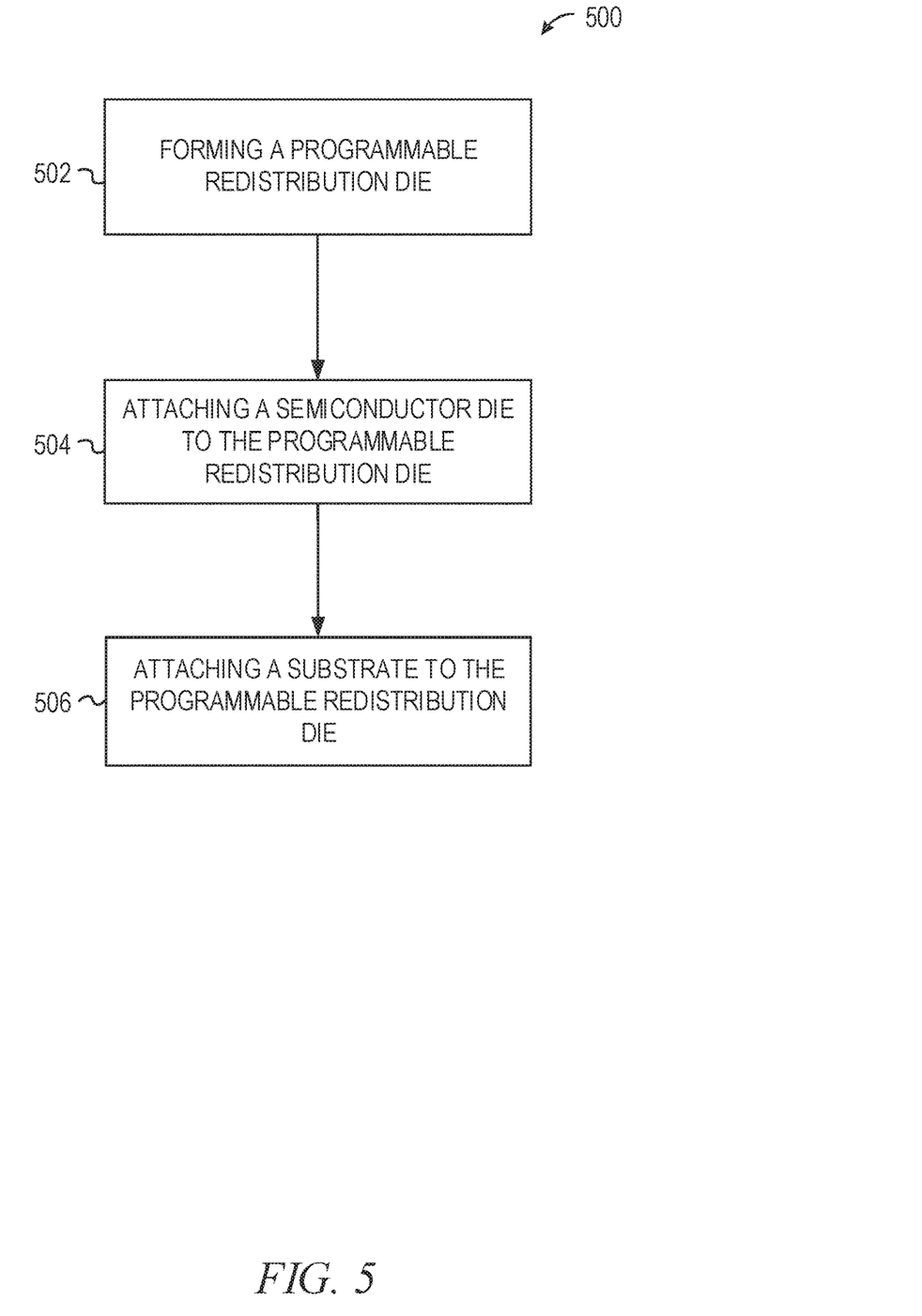
FIG. 5 is a process diagram of a method in accordance with some embodiments of the invention.

FIG. 5 shows steps in an example process 500 of creating an integrated circuit package including a programmable redistribution die. In FIG. 5 a programmable redistribution die is formed 502. In some examples, forming of the programmable redistribution die includes formation of an active layer on at least one side of the redistribution die. In some examples, forming of the programmable redistribution die further includes the formation of through silicon via interconnects through drilling and electroplating process. In some examples, forming a programmable redistribution die includes forming a programmable redistribution layer on at least one side of the redistribution die. A semiconductor die is attached to a first side of the redistribution die 504. A substrate is attached to a second side of the redistribution die 506. In some examples, the semiconductor die is attached to the redistribution die using interconnects. The interconnects may be silicon interconnects, solder balls, wire bonds, conductive epoxy, etc. In some examples, the substrate is attached to the redistribution die using interconnects. The interconnects may be silicon interconnects, solder balls, conductive epoxy, etc.

Figure 6:
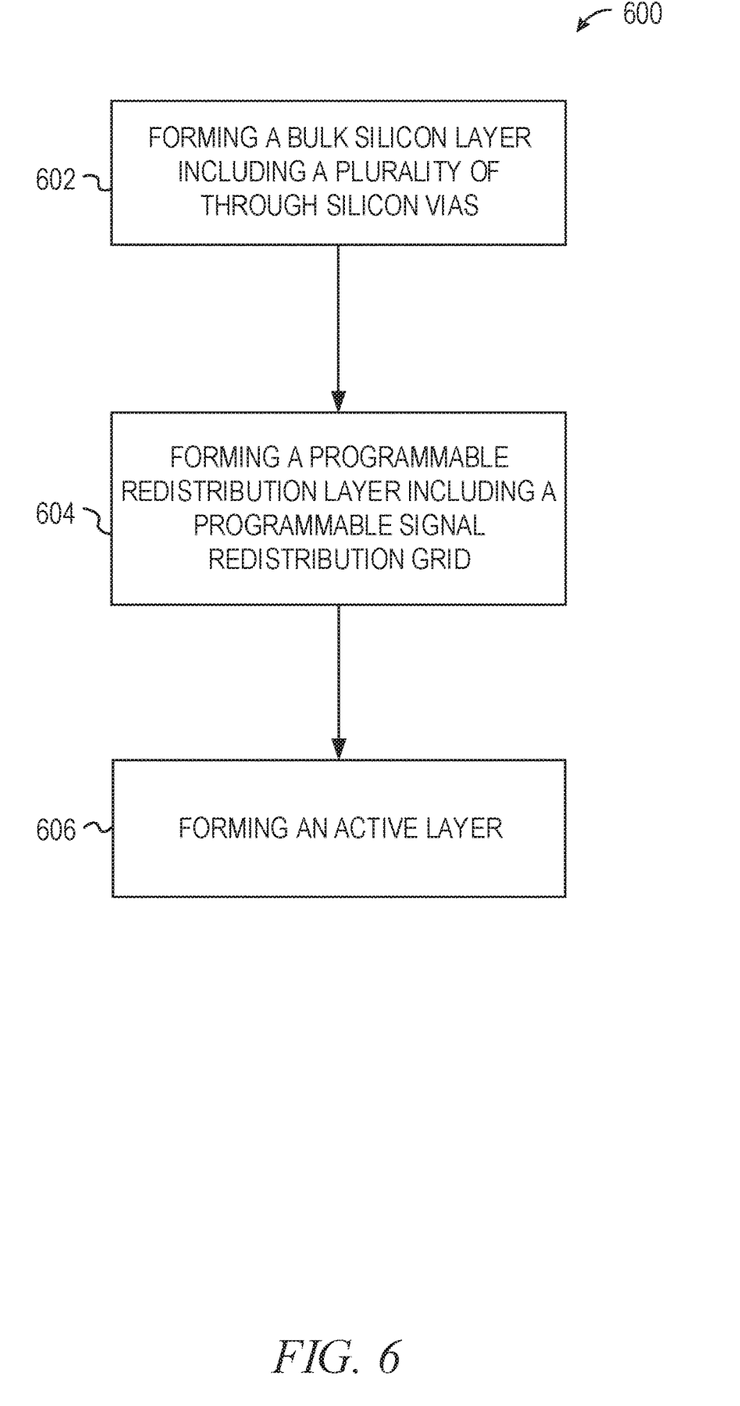
FIG. 6 is a process diagram of a method in accordance with some embodiments of the invention.

FIG. 6 shows steps in an example process 600 of forming a programmable redistribution die. In FIG. 6 a bulk silicon layer is formed including a plurality of through silicon vias 602. A programmable redistribution layer is formed on one side of the bulk silicon layer including a programmable redistribution grid 604. In an example, a transistor gate layer of the programmable redistribution layer is formed through silicon doping and a photolithography process. In an example, the programmable redistribution grid includes a vertical grid layer including vertical interconnects. The vertical interconnects are electrically coupled to the programmable redistribution layer through metal vias. In some examples, the programmable redistribution grid includes a horizontal grid layer including horizontal interconnects. The horizontal interconnects are electrically coupled to the vertical interconnects and programmable redistribution layer through example metal vias. In some examples, the process of forming the vertical and horizontal grid layers include photolithography and chemical etching. In some examples, the transistor gate layer is electrically coupled to the vertical interconnect layer such that the vertical interconnect layer is located between the programmable redistribution layer and the horizontal interconnect layer. In some examples, the horizontal interconnect layer is located between the transistor gate layer and vertical interconnect layer.

In some examples, forming a programmable redistribution die includes forming an active layer 606. The active layer is electrically coupled to the programmable redistribution layer in such a way that the bulk silicon layer is located between the active layer and the programmable redistribution layer. In some examples, the active layer includes a set of transistors and metal layers.

Figure 7:
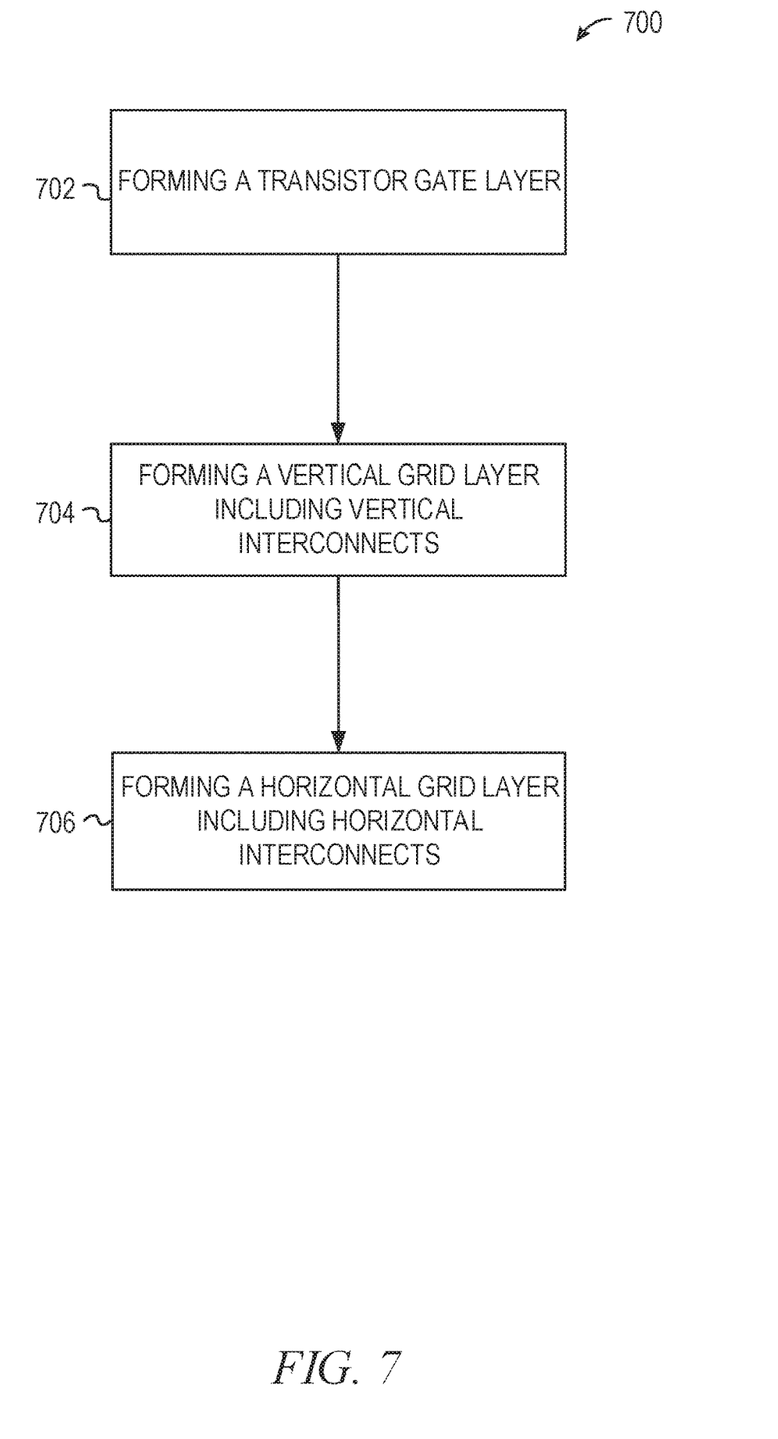
FIG. 7 is a process diagram of a method in accordance with some embodiments of the invention.

FIG. 7 shows steps in an example process 700 of forming a programmable redistribution grid. In FIG. 7 a transistor gate layer is formed 702. In an example, the transistor gate layer is formed through silicon doping and photolithography. A vertical grid layer is formed including vertical interconnects 704. In an example, the vertical interconnects are electrically coupled to the transistor gate layer through metal vias. A horizontal grid layer is formed including horizontal interconnects 706. In an example, the horizontal interconnects are electrically coupled to the vertical interconnects and transistor gate layer through example metal vias. The process of forming the vertical and horizontal grid layers may include photolithography and chemical etching. In some examples, forming the transistor gate layer includes forming a configurable router. In some examples, forming the configurable router includes forming multiplexers electrically coupled to the vertical grid layer and the horizontal grid layer.

Figure 8:
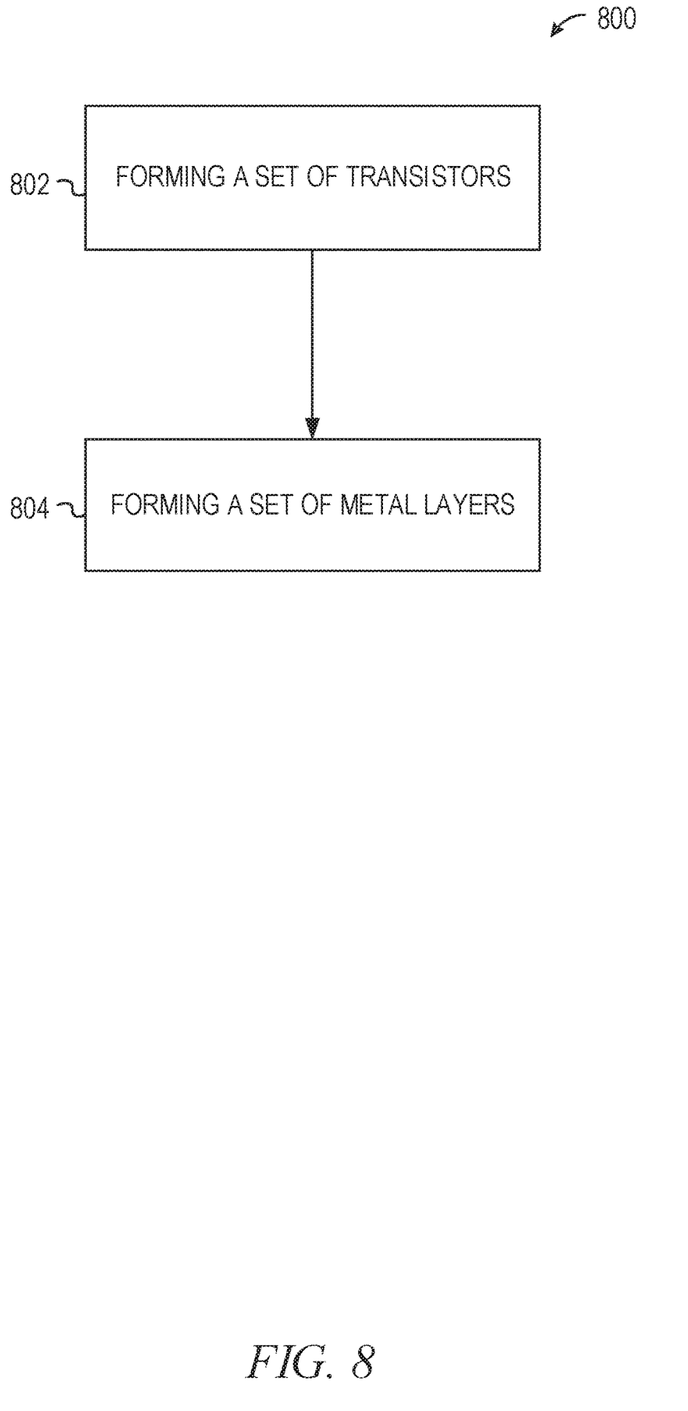
FIG. 8 is a process diagram of a method in accordance with some embodiments of the invention.

FIG. 8 shows steps in an example process 800 of forming an active layer. A set of transistors is formed through example silicon doping process 802. A set of metal layers is formed through example photolithography and chemical etching process 804. In some examples, the metal layers include both conductive portions, such as copper or tungsten metal traces, and non-conductive portions, which can include materials such as silicon dioxide, carbon-doped oxide, or other non-conductive materials. The conductive portions of the metal layers are separated from one another by a non-conductive portion. The active layer is electrically coupled to a programmable redistribution layer such that a bulk silicon layer is located between the active layer and the programmable redistribution layer. In some examples, the active layer includes an integrated circuit. An integrated circuit may be a central processing unit, a system-on-chip, a memory die, an analog to digital converter, a digital to analog converter, etc.

Figure 9:
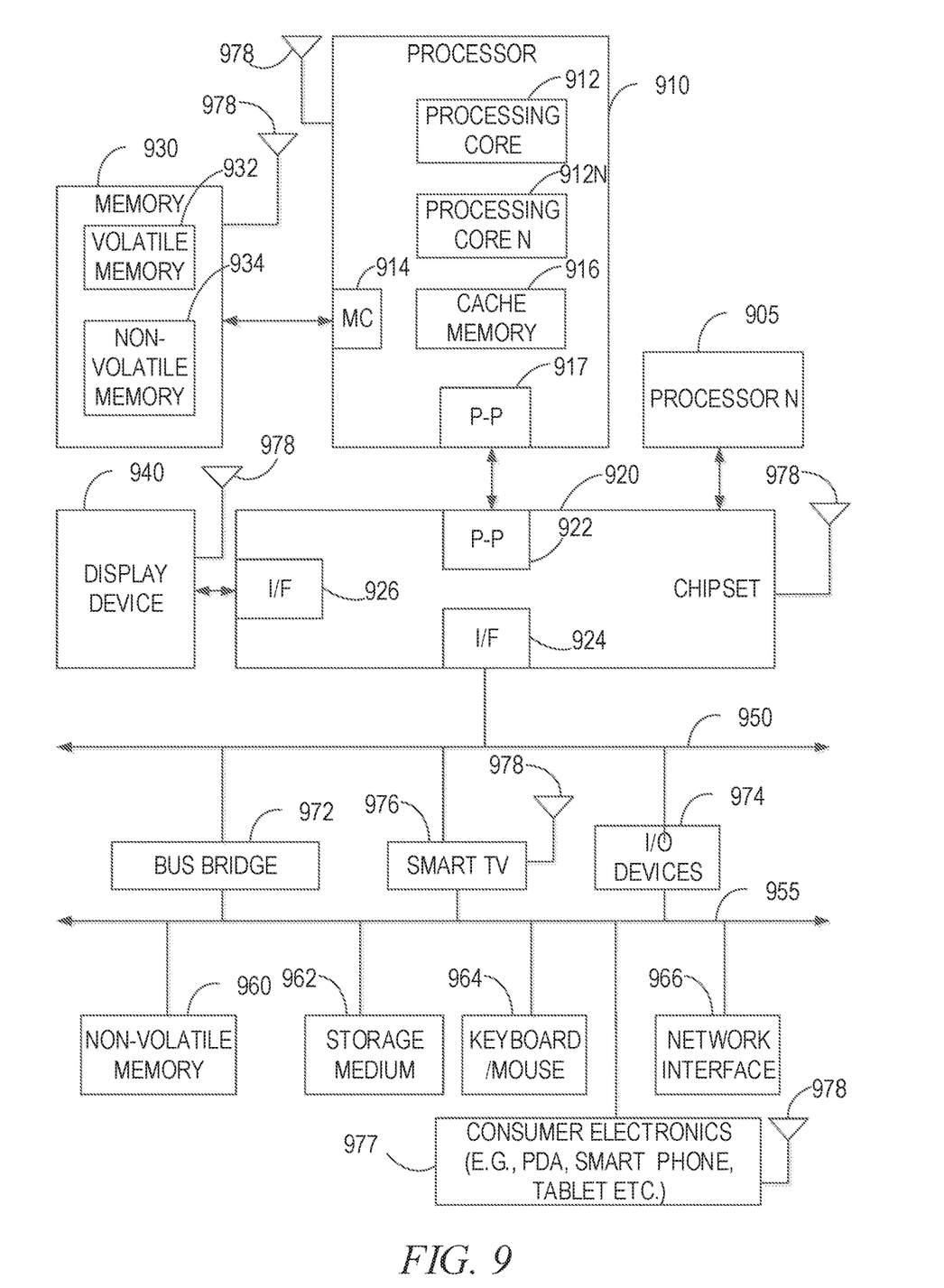
FIG. 9 is a block diagram of an electronic system in accordance with some embodiments of the invention.

FIG. 9 illustrates a system level diagram, according to one embodiment of the invention. For instance, FIG. 9 depicts an example of an electronic device (e.g., system) including the IC package utilizing programmable redistribution die as described in the present disclosure. FIG. 9 is included to show an example of a higher level device application for the present invention. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processing cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to electrically couple to other elements in system 900. In some embodiments of the invention, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices 972, 976, 974, 960, 962, 964, 966, 977, etc. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the invention, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920, via interface 924, couples with a non-volatile memory 960, a mass storage device(s) 962, a keyboard/mouse 964, a network interface 966, smart TV 976, consumer electronics 977, etc.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

To better illustrate the method and apparatuses disclosed herein, a non-limiting list of embodiments is provided here:

Example 1 is a programmable redistribution die, comprising: a bulk silicon layer including a plurality of vertical interconnects; a programmable redistribution layer including a programmable signal redistribution grid; wherein the programmable redistribution layer is electrically coupled to the bulk silicon layer; and wherein the programmable signal redistribution grid is configurable to select a signal path of a signal and to select any one of a plurality of substrate interconnects to output the signal.

In Example 2, the subject matter of Example 1 optionally includes wherein the programmable signal redistribution grid includes: a transistor gate layer; a vertical grid layer including vertical interconnects; and a horizontal grid layer including horizontal interconnects, the horizontal grid layer electrically coupled to the vertical grid layer.

In Example 3, the subject matter of Example 2 optionally includes wherein the transistor gate layer includes a configurable router.

In Example 4, the subject matter of Example 3 optionally includes wherein the configurable router includes multiplexers electrically coupled to the vertical grid layer and the horizontal grid layer.

In Example 5, the subject matter of any one or more of Examples 1-4 optionally include an active layer electrically coupled to the bulk silicon layer, wherein the bulk silicon layer is located between the active layer and the programmable redistribution layer.

In Example 6, the subject matter of Example 5 optionally includes wherein the active layer includes: a set of transistors; and a set of metal layers.

In Example 7, the subject matter of any one or more of Examples 1-6 optionally include a central processing unit.

In Example 8, the subject matter of any one or more of Examples 1-7 optionally include wherein the vertical interconnects are through silicon via interconnects.

In Example 9, the subject matter of any one or more of Examples 1-8 optionally include wherein the programmable redistribution die includes a memory which contains an instruction set for programming the programmable redistribution die.

Example 10 is a semiconductor device, comprising: a programmable redistribution die including: a bulk silicon layer including vertical interconnects; and a programmable redistribution layer including a programmable signal redistribution grid, the programmable redistribution layer electrically coupled to the bulk silicon layer; a semiconductor die attached to a first side of the programmable redistribution die; and a substrate attached to a second side of the programmable redistribution die.

In Example 11, the subject matter of Example 10 optionally includes wherein the programmable signal redistribution grid includes: a transistor gate layer including a configurable router; a vertical grid layer including vertical interconnects; and a horizontal grid layer including horizontal interconnects, the horizontal grid layer electrically coupled to the vertical grid layer.

In Example 12, the subject matter of Example 11 optionally includes wherein the configurable router includes multiplexers electrically coupled to the vertical grid layer and the horizontal grid layer.

In Example 13, the subject matter of any one or more of Examples 10-12 optionally include an active layer, wherein the active layer includes: a set of transistors; and a set of metal layers.

In Example 14, the subject matter of Example 13 optionally includes wherein the active layer is included in the programmable redistribution die and is electrically is coupled to the bulk silicon layer, wherein the bulk silicon layer is located between the active layer and the programmable redistribution layer.

In Example 15, the subject matter of Example 14 optionally includes wherein the programmable redistribution die includes a central processing unit.

In Example 16, the subject matter of any one or more of Examples 14-15 optionally include wherein the semiconductor die is a memory die.

In Example 17, the subject matter of any one or more of Examples 13-16 optionally include wherein the active layer is included in the semiconductor die, wherein the active layer is electrically coupled to the bulk silicon layer of the programmable redistribution die.

In Example 18, the subject matter of Example 17 optionally includes wherein the semiconductor die is a central processing unit.

In Example 19, the subject matter of any one or more of Examples 10-18 optionally include wherein the bulk silicon layer includes through silicon via interconnects.

In Example 20, the subject matter of any one or more of Examples 10-19 optionally include wherein the programmable redistribution die includes a memory which contains an instruction set for programming the programmable redistribution die.

Example 21 is a method comprising: forming a programmable redistribution die including: forming a bulk silicon layer including a plurality of through silicon via interconnects; and forming a programmable redistribution layer including a programmable signal redistribution grid, the programmable redistribution layer electrically coupled to the bulk silicon layer; attaching a semiconductor die to a first side of the programmable redistribution die; and attaching a substrate to a second side of the programmable redistribution die, the second side opposite the first side.

In Example 22, the subject matter of Example 21 optionally includes wherein forming the programmable signal redistribution grid includes: forming a transistor gate layer; forming a vertical grid layer including vertical interconnects; and forming a horizontal grid layer including horizontal interconnects, the horizontal grid layer electrically coupled to the vertical grid layer.

In Example 23, the subject matter of Example 22 optionally includes wherein forming the transistor gate layer includes forming a configurable router.

In Example 24, the subject matter of Example 23 optionally includes wherein forming the configurable router includes forming multiplexers electrically coupled to the vertical grid layer and the horizontal grid layer.

In Example 25, the subject matter of any one or more of Examples 21-24 optionally include wherein forming the programmable redistribution die further includes forming an active layer, wherein the active layer is electrically coupled to the bulk silicon layer, wherein the bulk silicon layer is located between the active layer and the programmable redistribution layer.

In Example 26, the subject matter of Example 25 optionally includes wherein forming the active layer includes: forming a set of transistors; and forming a set of metal layers.

In Example 27, the subject matter of any one or more of Examples 21-26 optionally include wherein forming the programmable redistribution die includes using silicon lithographic techniques.

These and other examples and features of the present programmable redistribution die, programmable redistribution die systems, and related methods will be set forth in part in the following detailed description. This overview is intended to provide non-limiting examples of the present subject matter—it is not intended to provide an exclusive or exhaustive explanation. The detailed description below is included to provide further information about the present programmable redistribution die, programmable redistribution die systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first." "second." and "third." etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A programmable redistribution die, comprising:
   a bulk silicon layer including a plurality of vertical interconnects;
   a programmable redistribution layer including a programmable signal redistribution grid; wherein the programmable redistribution layer is electrically coupled to the bulk silicon layer; and
   wherein the programmable signal redistribution grid is configurable to select a signal path of a signal and to select any one of a plurality of substrate interconnects to output the signal, wherein the programmable signal redistribution grid includes:
   a transistor gate layer;
   a vertical grid layer including vertical interconnects; and
   a horizontal grid layer including horizontal interconnects, the horizontal grid layer electrically coupled to the vertical grid layer.

2. The programmable redistribution die of claim 1, wherein the transistor gate layer includes a configurable router.

3. The programmable redistribution die of claim 2, wherein the configurable router includes multiplexers electrically coupled to the vertical grid layer and the horizontal grid layer.

4. The programmable redistribution die of claim 1, further including an active layer electrically coupled to the bulk silicon layer, wherein the bulk silicon layer is located between the active layer and the programmable redistribution layer.

5. The programmable redistribution die of claim 4, wherein the active layer includes:
   a set of transistors; and
   a set of metal layers.

6. The programmable redistribution die of claim 1, further including a central processing unit.

7. The programmable redistribution die of claim 1, wherein the vertical interconnects are through silicon via interconnects.

8. A semiconductor device, comprising:
   a programmable redistribution die including:
   a bulk silicon layer including vertical interconnects; and
   a programmable redistribution layer including a programmable signal redistribution grid, the programmable redistribution layer electrically coupled to the bulk silicon layer;
   a semiconductor die attached to a first side of the programmable redistribution die; and
   a substrate attached to a second side of the programmable redistribution die.

9. The semiconductor device of claim 8, wherein the programmable signal redistribution grid includes:
   a transistor gate layer including a configurable router;
   a vertical grid layer including vertical interconnects; and
   a horizontal grid layer including horizontal interconnects, the horizontal grid layer electrically coupled to the vertical grid layer.

10. The semiconductor device of claim 9, wherein the configurable router includes multiplexers electrically coupled to the vertical grid layer and the horizontal grid layer.

11. The semiconductor device of claim 8, further including an active layer, wherein the active layer includes:
    a set of transistors; and
    a set of metal layers.

12. The semiconductor device of claim 11, wherein the active layer is included in the programmable redistribution die and is electrically is coupled to the hulk silicon layer, wherein the bulk silicon layer is located between the active layer and the programmable redistribution layer.

13. The semiconductor device of claim 12, wherein the programmable redistribution die includes a central processing unit.

14. The semiconductor device of claim 12, wherein the semiconductor die is a memory die.

15. The semiconductor device of claim 11, wherein the active layer is included in the semiconductor die, wherein the active layer is electrically coupled to the bulk silicon layer of the programmable redistribution die.

16. The semiconductor device of claim 15, wherein the semiconductor die is a central processing unit.

17. The semiconductor device of claim 8, wherein the bulk silicon lave includes through silicon via interconnects.

18. A method comprising:
forming a programmable redistribution die including:
forming a bulk silicon layer including a plurality of through silicon via interconnects; and
forming a programmable redistribution layer including a programmable signal redistribution grid, the programmable redistribution layer electrically coupled to the bulk silicon layer;
attaching a semiconductor die to a first side of the programmable redistribution die; and
attaching a substrate to a second side of the programmable redistribution die, the second side opposite the first side.

19. The method of claim 18, wherein forming the programmable signal redistribution grid includes:
forming a transistor gate layer;
forming a vertical grid layer including vertical interconnects; and
forming a horizontal grid layer including horizontal interconnects, the horizontal grid layer electrically coupled to the vertical grid layer.

20. The method of claim 19, wherein forming the transistor gate layer includes forming a configurable router.

21. The method of claim 20, wherein forming the configurable router includes forming multiplexers electrically coupled to the vertical grid layer and the horizontal grid layer.

22. The method of claim 18, wherein forming the programmable redistribution die further includes forming an active layer, wherein the active layer is electrically coupled to the bulk silicon layer, wherein the bulk silicon layer is located between the active layer and the programmable redistribution layer.

23. The method of claim 22, wherein forming the active layer includes:
forming a set of transistors; and
forming a set of metal layers.

24. The method of claim 18, wherein forming the programmable redistribution die includes using silicon lithographic techniques.

* * * * *

UNITED STATES PATENT AND TRADEMARK OFFICE
CERTIFICATE OF CORRECTION

| | | |
|---|---|---|
| PATENT NO. | : 10,943,864 B2 | Page 1 of 1 |
| APPLICATION NO. | : 16/469100 | |
| DATED | : March 9, 2021 | |
| INVENTOR(S) | : Goh et al. | |

It is certified that error appears in the above-identified patent and that said Letters Patent is hereby corrected as shown below:

On the Title Page

In Column 2, under "Other Publications", Line 1, delete "Internationai" and insert --International-- therefor In the Claims In Column 11, Line 66, in Claim 1, delete "includes:" and insert --includes;-- therefor In Column 12, Line 54, in Claim 12, delete "hulk" and insert --bulk-- therefor In Column 13, Line 2, in Claim 17, delete "lave" and insert --layer-- therefor Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*